United States Patent
Holt et al.

(10) Patent No.: US 8,879,254 B2
(45) Date of Patent: Nov. 4, 2014

(54) METHODS AND APPARATUS FOR COMPACT ACTIVE COOLING

(75) Inventors: Brendon R. Holt, Tucson, AZ (US);
Reagan Branstetter, Tucson, AZ (US);
Chad E. Boyack, Tucson, AZ (US);
Kevin R. Hopkins, Tucson, AZ (US)

(73) Assignee: Raytheon Company, Waltham, MA (US)

(*) Notice: Subject to any disclaimer, the term of this patent is extended or adjusted under 35 U.S.C. 154(b) by 214 days.

(21) Appl. No.: 12/135,929

(22) Filed: Jun. 9, 2008

(65) Prior Publication Data

US 2008/0310102 A1    Dec. 18, 2008

Related U.S. Application Data

(60) Provisional application No. 60/942,989, filed on Jun. 8, 2007.

(51) Int. Cl.
| | |
|---|---|
| H05K 7/20 | (2006.01) |
| H01L 23/473 | (2006.01) |
| H05K 7/14 | (2006.01) |
| F28F 7/00 | (2006.01) |
| H05K 5/00 | (2006.01) |

(52) U.S. Cl.
CPC .......... H05K 7/20218 (2013.01); H01L 23/473 (2013.01); H05K 7/1434 (2013.01)
USPC .......... 361/699; 361/701; 361/719; 361/758; 165/80.4; 165/104.33; 257/714

(58) Field of Classification Search
CPC .......... H05K 7/20218; H05K 7/20254; H05K 7/20263; H01L 23/473
USPC .......... 361/699, 701, 702, 679.53; 165/80.4, 165/80.5, 104.33; 174/15.1; 257/714; 62/259.2
See application file for complete search history.

(56) References Cited

U.S. PATENT DOCUMENTS

| | | | | |
|---|---|---|---|---|
| 5,060,115 | A * | 10/1991 | Sewell | 361/710 |
| 6,351,383 | B1 * | 2/2002 | Payton | 361/704 |
| 6,404,636 | B1 * | 6/2002 | Staggers et al. | 361/704 |
| 2005/0122686 | A1 * | 6/2005 | Oyamada | 361/699 |
| 2006/0113066 | A1 * | 6/2006 | Mongia et al. | 165/104.33 |
| 2006/0158849 | A1 * | 7/2006 | Martin et al. | 361/699 |

* cited by examiner

*Primary Examiner* — Zachary M Pape

(57) ABSTRACT

Methods and apparatus for compact active cooling for missile applications generally comprise a circuit card assembly level closed loop fluid filled cooling system for cooling high power components such as microprocessors. The present invention utilizes a cooling system constrained to a single circuit card assembly providing for a drop in replacement for current passively cooled circuit card assemblies.

20 Claims, 5 Drawing Sheets

METHODS AND APPARATUS FOR COMPACT ACTIVE COOLING

CROSS-REFERENCES TO RELATED APPLICATIONS

This application claims the benefit of U.S. Provisional Patent Application No. 60/942,989, filed Jun. 08, 2007, and incorporates the disclosure of the application by reference.

BACKGROUND OF INVENTION

Electronic components often require cooling during operation to reduce the probability of failure and increase the reliability of the entire system. Microchips are often the most demanding component on a circuit card assembly due to their operating speeds and power consumption. Conventional methods of cooling microchips typically involve a form of passive cooling where heat is transferred from the microchip through a heatsink and then into the ambient environment. Often, fans are used to move air over the heatsink, increasing the heat transfer rate from the microchip.

In a typical missile application, a heat source is cooled passively by conducting heat through several media and ultimately to the missile housing itself. As chip level heat loads increase, the ability of passive thermal management systems to effectively cool electrical components is challenged. In confined installations such as a missile application, conventional passive thermal management techniques may not provide sufficient cooling.

SUMMARY OF THE INVENTION

Methods and apparatus for compact active cooling for missile applications according to various aspects of the present invention comprise a series of heat exchangers and a cooling fluid contained within closed loop circulation system. The heat exchangers and circulation system actively remove heat from a heat source on the circuit card assembly by moving a cooling fluid through the heat exchangers.

BRIEF DESCRIPTION OF THE DRAWING FIGURES

A more complete understanding of the present invention may be derived by referring to the detailed description and claims when considered in connection with the following illustrative figures. In the following figures, like reference numbers refer to similar elements and steps throughout the figures.

FIG. 1 representatively illustrates a projectile in accordance with an exemplary embodiment of the present invention.

FIG. 2 representatively illustrates multiple circuit card assemblies stacked together with spacer ring.

FIG. 3 representatively illustrates a circuit card assembly in accordance with an exemplary embodiment of the present invention.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present specification and accompanying drawings describe exemplary embodiments by way of illustration and best mode. While these exemplary embodiments are described, other embodiments may be realized, and changes may be made without departing from the spirit and scope of the invention. The detailed description is presented for purposes of illustration only and not of limitation. For example, the steps recited in any of the methods or process descriptions may be executed in any suitable order and are not limited to the order presented. Further, conventional mechanical and electrical aspects and elements of the individual operating components of the systems may not be described in detail. The representations of the various components are intended to represent exemplary functional relationships, positional relationships, and/or physical couplings between the various elements. Many alternative or additional functional relationships, physical relationships, optical relationships, or physical connections may be present in a practical system.

The present invention is described partly in terms of functional components and various methods. Such functional components may be realized by any number of components configured to perform the specified functions and achieve the various results. For example, the present invention may employ various beat exchangers, cooling fluids, ducting, and plumbing, such as pumps, tubing, heatsinks, and the like, which may carry out a variety of functions. In addition, the present invention may be practiced in conjunction with any number of commercial and/or military applications and the system described is merely one exemplary application for the invention. Further, the present invention may employ any number of conventional techniques for thermal management of electrical components, and the like.

Methods and apparatus for compact active cooling according to various aspects of the present invention operate in conjunction with any suitable commercial and/or military application. For example, suitable military applications may include missiles, guided projectiles, and/or spacecraft. Suitable commercial applications may include commercial aviation applications, automobile applications, and/or telecommunication applications.

Figure 1:
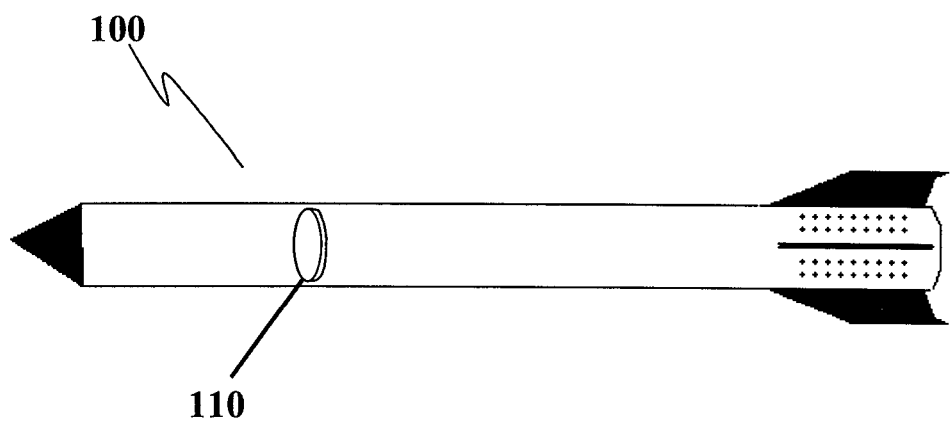

Referring to FIG. 1, in one embodiment, methods and apparatus for compact active cooling may operate in conjunction with a projectile 100 and an electronics assembly 110. The projectile 100 may include any device that is launched at a target such as a missile, a guided artillery round, a penetrator, or an interceptor.

Figure 2:
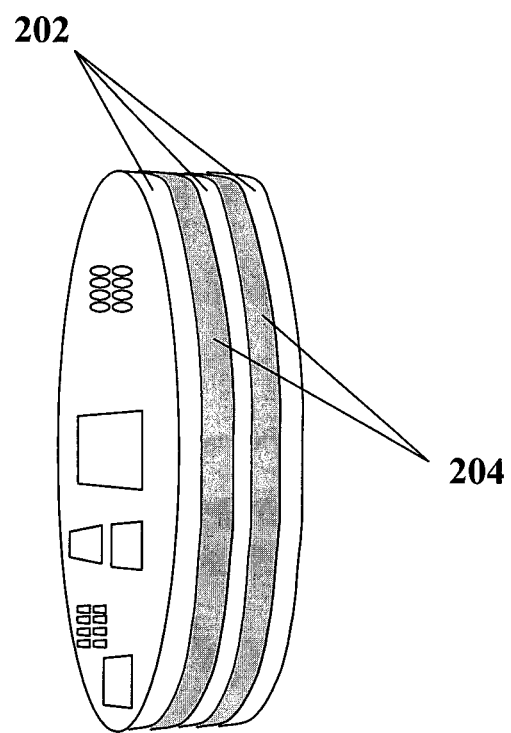

The electronics assembly 110 may comprise any system inside the projectile 100 that generates heat and requires cooling, such as a guidance system, positioning system, power supply, and the like. The electronics assembly 110 may comprise a single circuit card assembly (CCA) or several CCA's arranged together. Referring to FIG. 2, for example, in a missile application, individual CCA's 202 may be stacked together to form the electronics assembly 110. Each CCA 202 is separated from the others by a spacer 204. A gap between the CCAs 202 prevents contact of the CCAs and/or passive thermal transfer.

The spacer 204 connects the individual CCAs 202 together and provides a gap between each CCA 202. The spacer 204 may comprise any system or structure for mounting CCAs 202 such as a ring, a bracket, a frame, pegs, or struts. In the present embodiment, the spacer 204 comprises a metallic ring placed around the perimeter of the CCA 202. The spacer 204 may also attach to or engage the projectile 100 housing or body.

The spacer 204 may be used to conductively transfer heat from the CCAs 202 to the projectile 100 body or housing. To perform this function, the spacer 204 comprises a material capable of conductive heat transfer, such as metal. The spacer 204 further engages at least a portion of the projectile 100 housing, body, or support structure to conduct the heat absorbed from the electronics assembly 110 to the projectile 100.

The CCA 202 is a collection of electrical components connected together on a printed wiring board designed to perform at least one function. The CCA 202 may comprise any system for performing electrical functions, such as a guidance computer, a navigation system, or a communication system. The CCA 202 may comprise any shape or size. In the present embodiment, the CCA 202 comprises a circular-shaped printed wiring board containing various types of electrical components. The size of the CCA 202 is constrained by the type of projectile 110 being utilized. For example, in one embodiment, the CCA 202 may be up to ten inches in diameter while in another application, such as a missile, the diameter may be limited to four to five inches in diameter.

Figure 3:
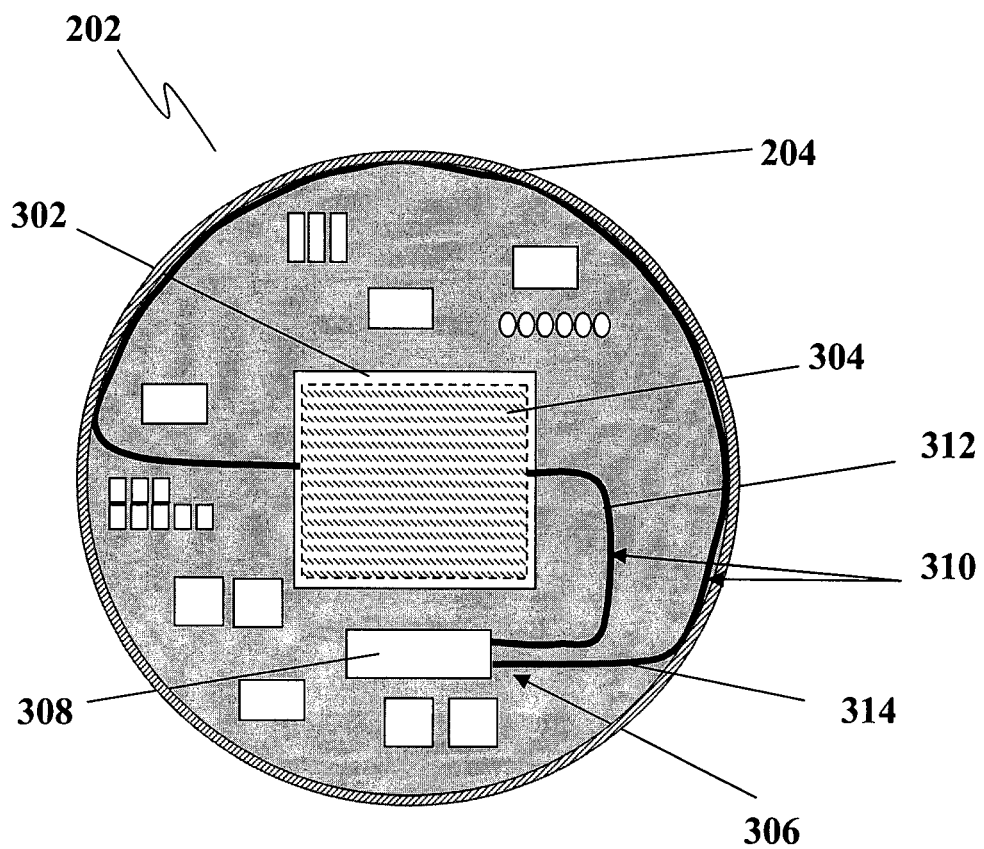

Referring now to FIG. 3, in the present embodiment, the CCA 202 may also comprise a microprocessor 302, a heat sink 304 and a cooling system 306. The heat sink 304 is affixed to a surface of the microprocessor 302 and is connected to the cooling system 306. The cooling system 306 may be further disposed adjacent to the spacer 204. The microprocessor 302, the heat sink 304, and the cooling system 306 may, however, be configured in any suitable manner to provide active cooling to the CCA 202.

The microprocessor 302 is a complex integrated circuit and is typically the main source of heat on the CCA 202. Controlling heat dissipation from the microprocessor 302 is important to ensure reliable operation. It is not uncommon for high power microprocessors to have heat loads from twelve to seventy-five watts or more. For example, in the present embodiment, the microprocessor 302 generates heat loads in excess of 100 watts. The microprocessor 302 need not, however, generate heat loads over twelve watts.

The heat sink 304 engages the microprocessor 302 and absorbs heat generated by the microprocessor 302 and conducts it away from the microprocessor 302. The heat sink 304 may comprise any system for moving heat away from the microprocessor 302 such as a fin-tube heat exchanger, a cold-plate, a heat conductive block, and the like. In the present embodiment, the heat sink 304 comprises a metallic plate with at least one internal flow passage for a working fluid to move through. The heat sink 304 is further connected to the cooling system 306.

The heat sink 304 may engage the microprocessor 302 by any suitable method such as direct contact or by the use of a thermally conductive adhesive such as a room temperature vulcanizing silicone. The heat sink 304 may be mechanically secured to the microprocessor 302 by screws or a clamp or adhesively affixed to one or more surfaces of the microprocessor 302. The heat sink 304 may also comprise any suitable material for absorbing heat from the microprocessor 302 such as a metal, an alloy, or a heat conductive ceramic.

The cooling system 306 cools a heat source on the CCA 202. The cooling system 306 may comprise any system that provides active cooling at the CCA 202 level itself Referring to FIG. 3, the cooling system 306 of the present embodiment comprises a closed loop fluid-filled compact active cooling system confined to the same CCA 202 as the microprocessor 302. The closed loop fluid-filled cooling system 306 is connected to the heat sink 304 and is configured to move heat away from the microprocessor 302 and ultimately to the projectile 100 or other internal structures. In the present embodiment, the closed loop fluid filled cooling system 306 comprises a pump 308, a plumbing duct 310, a second heat exchanger, and a working fluid that is moved through the plumbing duct 310. The plumbing duct 310 exits the pump 308 and is connected to the heat sink 304. The plumbing duct 310 is then directed along the second heat exchanger before returning to the pump 308. The pump 308 and the plumbing duct 310 may, however, be configured in any suitable manner to absorb heat from the microprocessor 302 and conductively transfer that heat to the projectile 100.

Figure 5:
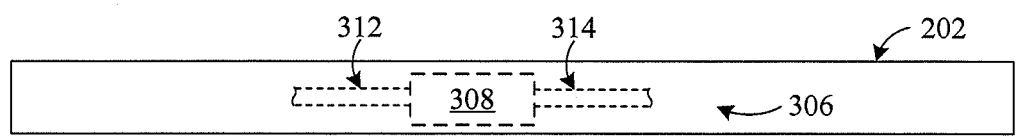
FIG. 5 illustrates a circuit card assembly with an integrated circulation system.

The closed loop fluid-filled cooling system 306 may be confined to the surface area of the CCA 202 or it may extend into an area adjacent to the CCA 202. A closed loop fluid-filled cooling system 306 that is constrained to the CCA 202 may be used as a drop in replacement for existing projectile 100 designs that utilize passive cooling techniques or it may be used as the starting point of a new electronics assembly 110. By allowing drop in replacement of current CCA designs, the closed loop fluid-filled cooling system 306 may be used to upgrade current projectile 10 designs to take advantage of the increased computing capability of current and future high power microprocessors 302. In one embodiment, closed loop fluid-filled cooling system 306 is integrated in the CCA 202 (such as is shown in FIG. 5), and the entire CCA 202 may be replaced. In another embodiment, the CCA 202 may be retrofitted with a closed loop fluid-filled cooling system 306, where the closed loop fluid-filled cooling system 306 may replace a passive heat sink.

The working fluid, in accordance with various aspects of the present invention, may comprise any fluid, liquid/vapor or liquid/gas mixture suitable for cooling, stabilizing temperature, and/or the like. In a representative embodiment of the present invention, fluids used in accordance with various aspects of the present invention may include water, a propylene glycol/water solution, fluorocarbons, or a polyalphaolefin fluid solution.

The pump 308 moves working the fluid through the closed loop fluid-filled cooling system 306. The pump 308 may comprise any system for circulating fluid such as a micro pump, a mini pump, a rotary pump, a centrifugal pump, or the like. Projectiles 100 are routinely subjected to shock and vibration forces that are not found in typical electronic assemblies 110. To maintain a reliable assembly, the CCA 202 may be ruggedized. For example, during the launch phase of a missile, acceleration forces subject the CCA 202 to increased acceleration loading. In the present embodiment, the pump 308 comprises a small mini pump affixed directly to the CCA 202. The compact mass of the pump 308 decreases the moment of inertia of the pump 308 making it less subject to excessive loading during transient events. The pump 308 may also be electrically controlled and be thermostatically regulated for continuous or intermittent operation providing more precise control over heat transfer rates away from the microprocessor 302. Further, in one embodiment, the pump 308 is configured to withstand rugged conditions, such as a 10 G maneuver. In another embodiment, the pump 308 may comprise power consumption constraints of under 200 watts, and a volumetric flow rate of approximately 1 L/minute. In yet another embodiment, the pump 308 is configured to survive 200 hour meantime between failure.

The plumbing duct 310 directs the working fluid through the closed loop fluid-filled cooling system 306. The plumbing duct 310 may comprise any system for controllably directing the flow of a fluid such as a pipe, a flexible tube, an enclosed channel, or a hose. Referring to FIG. 3, the plumbing duct in the present embodiment comprises a cold line 312 and a hot line 314. The cold line 312 directs the relatively cool working fluid from the pump 308 to the heat sink 304. The hot line 314 directs the heated fluid away from the heat sink 304, along the spacer 204 where heat is transferred from the fluid to the second heat exchanger, and then back to the pump 308.

The cold line 312 and hot line 314 may comprise any suitable material capable of controlling the direction of the fluid flow. For example, the cold line 312 may comprise a flexible plastic hose and the hot line may comprise a flexible metal tube capable of conductively transferring heat from the fluid to the second heat exchanger. Alternatively, the cold line 312 and the hot line 314 may comprise the same material.

Figure 6:
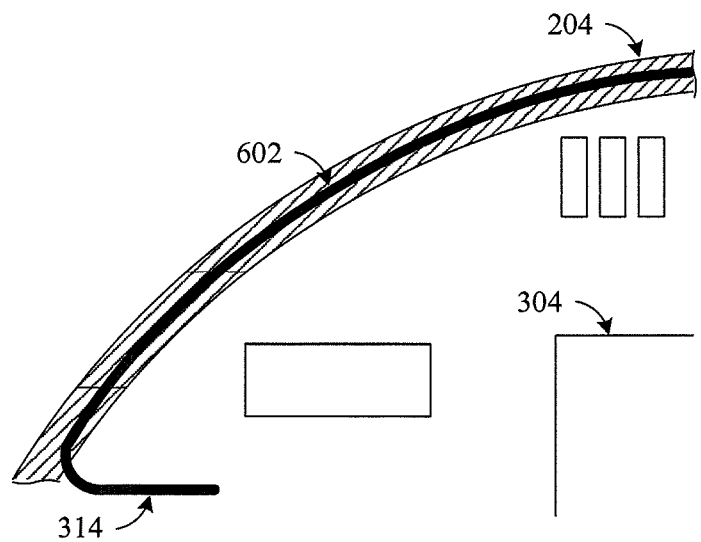
FIG. 6 illustrates a spacer ring having a channel adapted to receive a working fluid and act as a segment of a hot line.

The second heat sink absorbs heat from the hot line 314 and conductively dissipates that heat to the projectile 100. The second heat sink may comprise any system for absorbing heat from the plumbing duct 310 such as a fin-tube radiator, a cold plate, or a heat conductive body. Referring again to FIG. 3, the second heat sink of the present embodiment comprises the spacer 204. The traditional passive cooling capability of the spacer 204 is utilized as a path for ultimately transferring the heat of the microprocessor 302 to the projectile 100 body or an internal structure. The spacer 204 may be further configured to engage the hot line 314 or comprise a channel adapted to receive the working fluid and act as a segment of the hot line 314 (such as is shown in FIG. 6 where the spacer 204 includes a channel 602).

Figure 4:
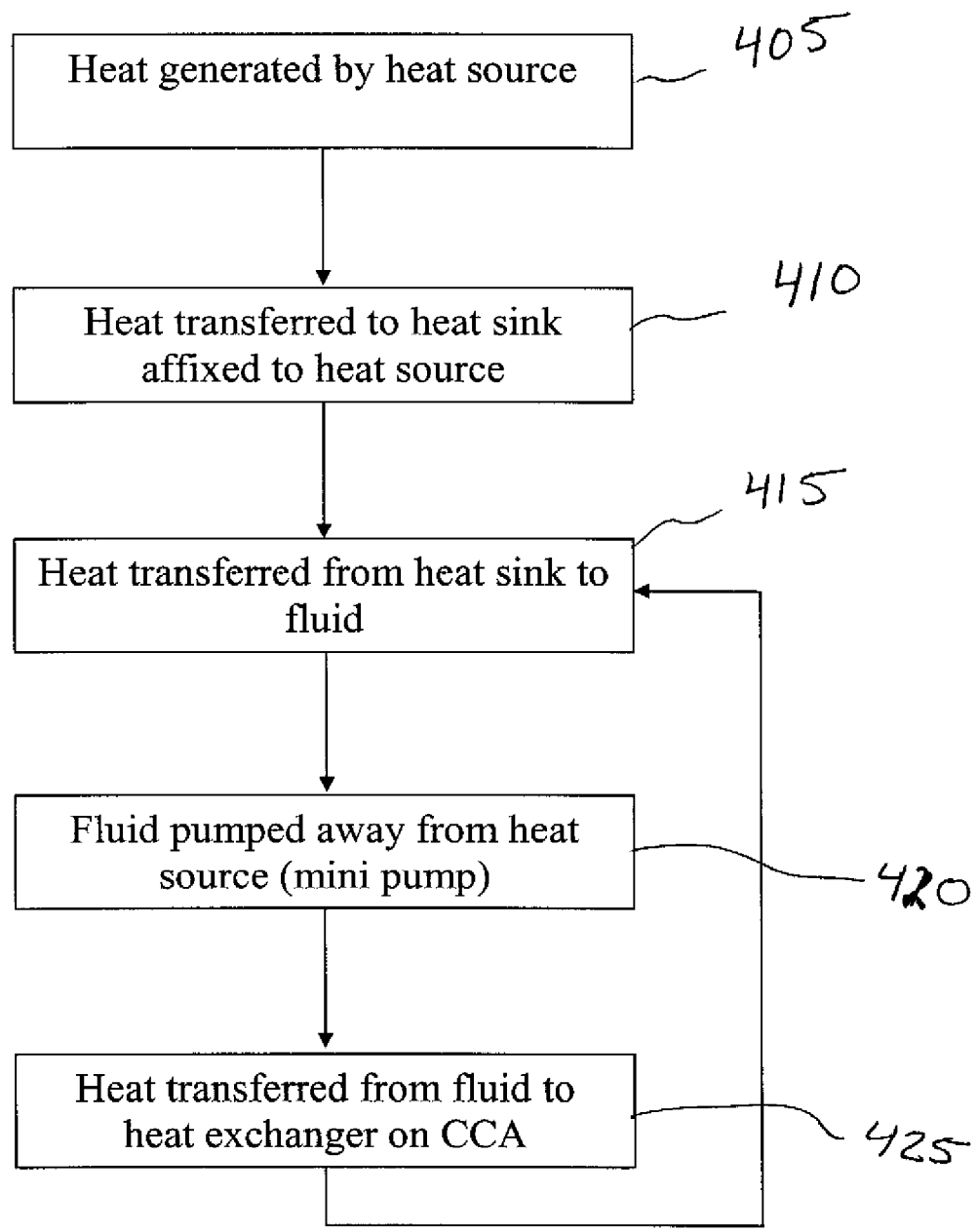
FIG. 4 is a block diagram of a method of cooling a heat source in accordance with an exemplary embodiment of the present invention.

Referring now to FIG. 4, in operation the electrical assembly 110 in a projectile 100 is activated prior to or during launch. The electrical assembly 110 comprises at least one CCA 202 which begins to function according to its design. As this happens, a heat source, such as a microprocessor 302, begins to operate and generate heat (405). As the projectile 100 is being readied for launch or is in flight, the heat generated by the heat source causes the temperature of the component to rise. If the temperature reaches a prescribed limit, such as the junction temperature of the integrated circuit, the component may fail.

To reduce the probability of failure a heat sink 304 is affixed to the heat source (410). The heat sink 304 conductively absorbs heat from the heat source and transfers that heat to another medium resulting in a reduction in the temperature of the component. A heat sink 304 is typically passive in that the heat it conductively absorbs is then passively convected to the ambient environment. In a high power microprocessor 302 application for example, the heat load generated by the microprocessor 302 may exceed the capacity of the heat sink 304 to passively dissipate enough heat to effectively cool the microprocessor 302.

The closed loop fluid cooling system 306 of the present embodiment comprises the pump 308, plumbing duct 310, and second heat exchanger that enhances the cooling rate of the heat sink 304. The pump 308 moves the working fluid such as a glycol/water solution through the heat sink 304. The working fluid then absorbs heat from the heat sink 304 (415) before being pumped away from the heat sink 304 (420). The heated fluid is then routed towards a second heat exchanger, such as the spacer 204, where the heat from the fluid is conductively transferred to the spacer 204 (425). After heat is removed from the fluid it is routed by the plumbing duct 310 back to the pump 308 and subsequently to the heat sink 304 where the process is repeated.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used in this description, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. A cooling system for a heat source on a circuit card assembly, the cooling system comprising:
    a first heat exchanger configured to absorb heat from the heat source;
    a circulation system disposed in or on the circuit card assembly, wherein the circulation system is configured to absorb heat from the first heat exchanger using a cooling fluid; and
    a second heat exchanger configured to absorb heat from the cooling fluid in the circulation system and to conductively transfer heat to a body or housing surrounding the circuit card assembly;
    wherein the second heat exchanger comprises a spacer attached to a periphery of the circuit card assembly;
    wherein the circulation system comprises a pump and a flow passage configured to transport the cooling fluid between the first heat exchanger and the spacer; and
    wherein the flow passage comprises a channel within a portion of the spacer.

2. The cooling system of claim 1, wherein the circulation system is substantially confined to an area of a printed wiring board of the circuit card assembly.

3. The cooling system of claim 1, wherein the flow passage travels along more than half of the periphery of the circuit card assembly.

4. The cooling system of claim 1, wherein:
the flow passage comprises a first flow passage;
a second flow passage is located inward of the first flow passage between the first flow passage and a center of the circuit card assembly; and
each flow passage is fluidly coupled to the pump.

5. The cooling system of claim 1, wherein the second heat exchanger is further configured to separate the circuit card assembly from a second circuit card assembly.

6. The cooling system of claim 5, wherein the circulation system is disposed between the circuit card assembly and the second circuit card assembly.

7. The cooling system of claim 1, wherein the circulation system is integrated in the circuit card assembly.

8. A circuit card assembly having a cooling assembly for a component configured to operate within a missile having a periphery, the cooling assembly comprising:
a first heat exchanger configured to absorb heat from the component;
a circulation system disposed in or on the circuit card assembly, the circulation system configured to absorb heat from the first heat exchanger using a cooling fluid, wherein the circulation system is substantially confined to an area of a printed wiring board of the circuit card assembly; and
a second heat exchanger configured to absorb heat from the cooling fluid in the circulation system and to conductively transfer heat to the periphery of the missile;
wherein the second heat exchanger comprises a spacer attached to a periphery of the circuit card assembly;
wherein the circulation system comprises a pump and a flow passage configured to transport the cooling fluid between the first heat exchanger and the spacer; and
wherein the flow passage comprises a channel within a portion of the spacer.

9. The circuit card assembly of claim 8, wherein the second heat exchanger is also located at the periphery of the missile.

10. The circuit card assembly of claim 8, wherein the flow passage travels along more than half of the periphery of the circuit card assembly.

11. The circuit card assembly of claim 8, wherein:
the flow passage comprises a first flow passage;
a second flow passage is located inward of the first flow passage between the first flow passage and a center of the circuit card assembly; and
each flow passage is fluidly coupled to the pump.

12. The circuit card assembly of claim 8, wherein the second heat exchanger is further configured to separate the circuit card assembly from a second circuit card assembly.

13. The circuit card assembly of claim 12, wherein the circulation system is disposed between the circuit card assembly and the second circuit card assembly.

14. The circuit card assembly of claim 8, wherein the circulation system is integrated in the circuit card assembly.

15. A method comprising:
transferring heat from a microchip of a circuit card assembly to a first heat transfer device in thermal contact with the microchip;
transferring heat from the first heat transfer device to a closed-loop circulation system, wherein the closed-loop circulation system is disposed in or on the circuit card assembly;
transferring heat from the closed-loop circulation system to a second heat transfer device; and
conductively transferring heat from the second heat transfer device to a body or housing surrounding the circuit card assembly;
wherein the second heat transfer device comprises a spacer attached to a periphery of the circuit card assembly;
wherein the circulation system comprises a pump and a flow passage that transports the cooling fluid between the first heat transfer device and the spacer; and
wherein the flow passage comprises a channel within a portion of the spacer.

16. The method of claim 15, wherein the flow passage travels along more than half of the periphery of the circuit card assembly.

17. The method of claim 15, wherein the second heat transfer device is configured to separate the circuit card assembly from a second circuit card assembly.

18. The method of claim 17, wherein the closed-loop circulation system is disposed between the circuit card assembly and the second circuit card assembly.

19. The method of claim 15, wherein:
the flow passage comprises a first flow passage;
a second flow passage is located inward of the first flow passage between the first flow passage and a center of the circuit card assembly; and
each flow passage is fluidly coupled to the pump.

20. The method of claim 15, wherein the closed-loop circulation system is integrated in the circuit card assembly.

* * * * *